(12) United States Patent (10) Patent No.: US 9,112,510 B2
Ishikawa (45) Date of Patent: Aug. 18, 2015

(54) REFERENCE VOLTAGE GENERATION CIRCUIT, OSCILLATION CIRCUIT INCLUDING THE SAME AND METHOD FOR CALIBRATING OSCILLATION FREQUENCY OF OSCILLATION CIRCUIT

(71) Applicant: FUJITSU SEMICONDUCTOR LIMITED, Yokohama-shi, Kanagawa (JP)

(72) Inventor: Kiyoshi Ishikawa, Yokosuka (JP)

(73) Assignee: SOCIONEXT INC., Yokohama (JP)

( * ) Notice: Subject to any disclaimer, the term of this patent is extended or adjusted under 35 U.S.C. 154(b) by 74 days.

(21) Appl. No.: 13/691,441

(22) Filed: Nov. 30, 2012

(65) Prior Publication Data

US 2013/0176082 A1 Jul. 11, 2013

(30) Foreign Application Priority Data

Jan. 11, 2012 (JP) ................. 2012-003115

(51) Int. Cl.
| | |
|---|---|
| G05F 1/10 | (2006.01) |
| G05F 3/02 | (2006.01) |
| H03L 7/00 | (2006.01) |
| H03F 3/45 | (2006.01) |
| G05F 3/30 | (2006.01) |
| H03L 1/00 | (2006.01) |
| H03L 1/02 | (2006.01) |

(Continued)

(52) U.S. Cl.
CPC .. *H03L 7/00* (2013.01); *G05F 3/30* (2013.01); *H03F 3/45179* (2013.01); *H03F 3/45183* (2013.01); *H03F 3/45475* (2013.01); *H03L 1/00* (2013.01); *H03L 1/02* (2013.01); *G11C 5/147* (2013.01); *H03F 2203/45138* (2013.01); *H03F 2203/45522* (2013.01); *H03K 3/0231* (2013.01)

(58) Field of Classification Search
CPC ........ G05F 3/30; G11C 5/147; H03K 3/0315; H03K 3/0231; H03L 7/00; H03L 1/00; H03L 1/02; H03F 3/45179; H03F 3/45475; H03F 2203/45138; H03F 2203/45522
USPC ............ 331/57, 111, 140, 143; 327/335, 539; 330/260
See application file for complete search history.

(56) References Cited

U.S. PATENT DOCUMENTS 5,523,721 A * 6/1996 Segawa et al. .................. 330/86
5,798,741 A * 8/1998 Kajihara .......................... 345/94

(Continued)

FOREIGN PATENT DOCUMENTS

DE 09-083309 A 3/1997
JP 55-018152 A 2/1980

(Continued)

*Primary Examiner* — Arnold Kinkead
*Assistant Examiner* — Richard Tan
(74) *Attorney, Agent, or Firm* — Arent Fox LLP

(57) ABSTRACT

A reference voltage generation circuit has: a first PN junction element; a second PN junction element having a higher forward direction voltage than the first PN junction element; a first differential amplifier inputting an anode of the first PN junction element and a first connection node between a first and a second resistor disposed in series between a first output of the first differential amplifier and a first potential, and generating a first output voltage at the first output; and a second differential amplifier inputting an anode of the second PN junction element and a second connection node between a fourth and a third resistor disposed in series between a second output of the second differential amplifier and the first output of the first differential amplifier, and generating a reference voltage at the second output. A resistance ratio between the third and the fourth resistors is variable.

15 Claims, 12 Drawing Sheets

(51) Int. Cl.
    *G11C 5/14* (2006.01)
    *H03K 3/0231* (2006.01)

(56) References Cited

U.S. PATENT DOCUMENTS

| | | |
|---|---|---|
| 6,462,625 B2 | 10/2002 | Kim |
| 7,880,532 B2 | 2/2011 | Takaramoto et al. |
| 2010/0013540 A1* | 1/2010 | Takaramoto et al. ......... 327/335 |

FOREIGN PATENT DOCUMENTS

| | | |
|---|---|---|
| JP | 55-018152 A | 2/1980 |
| JP | 5-251954 A | 9/1993 |
| JP | 5-251954 A | 9/1993 |
| JP | 8-185236 A | 7/1996 |
| JP | 8-185236 A | 7/1996 |
| JP | 09-083309 A | 3/1997 |
| JP | 2000-323939 A | 11/2000 |
| JP | 2000-323939 A | 11/2000 |
| JP | 2001-068976 | 3/2001 |
| JP | 2001-068976 A | 3/2001 |
| JP | 2002-33644 A | 1/2002 |
| JP | 2002-33644 A | 1/2002 |
| JP | 2008-252414 A | 10/2008 |
| JP | 2008-252414 A | 10/2008 |
| WO | WO 2008/120350 A | 9/2008 |
| WO | WO 2008/120350 A | 10/2008 |

* cited by examiner

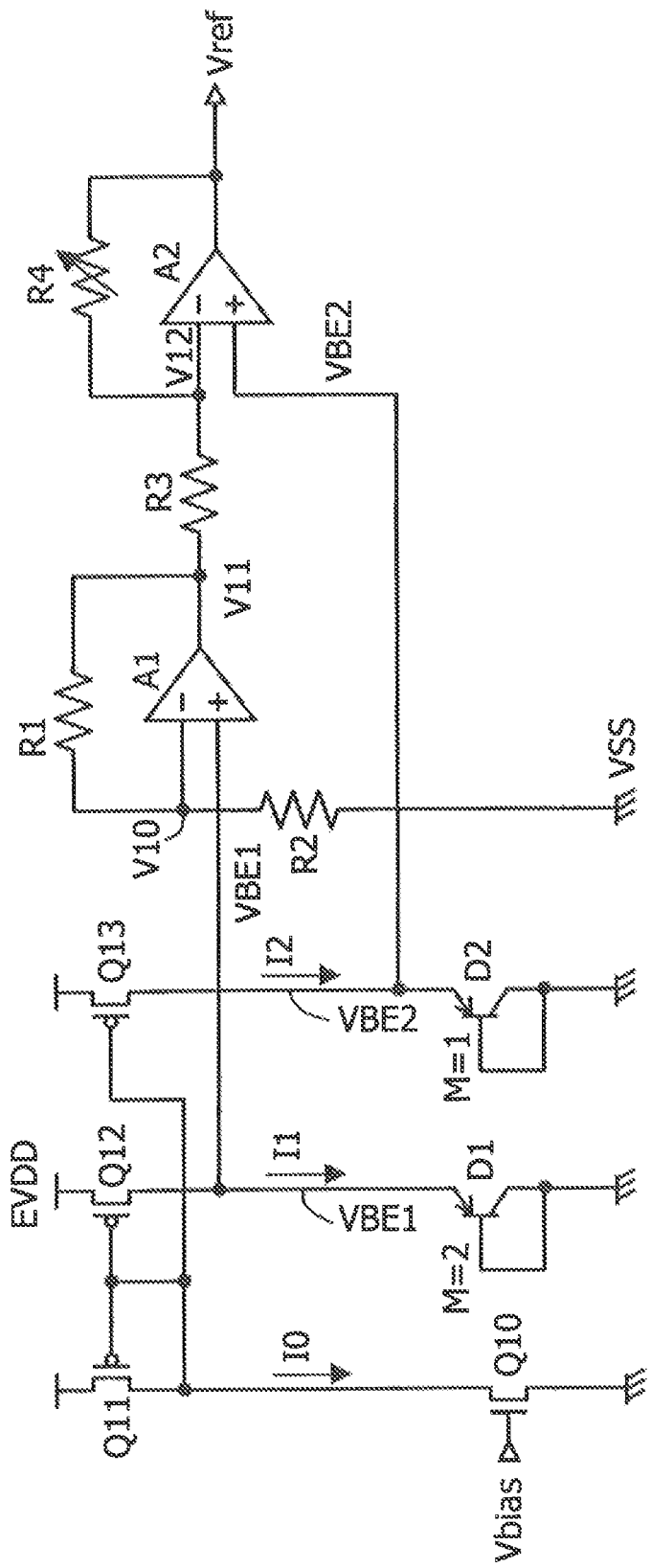
FIG.6 Band Gap Ref. 10

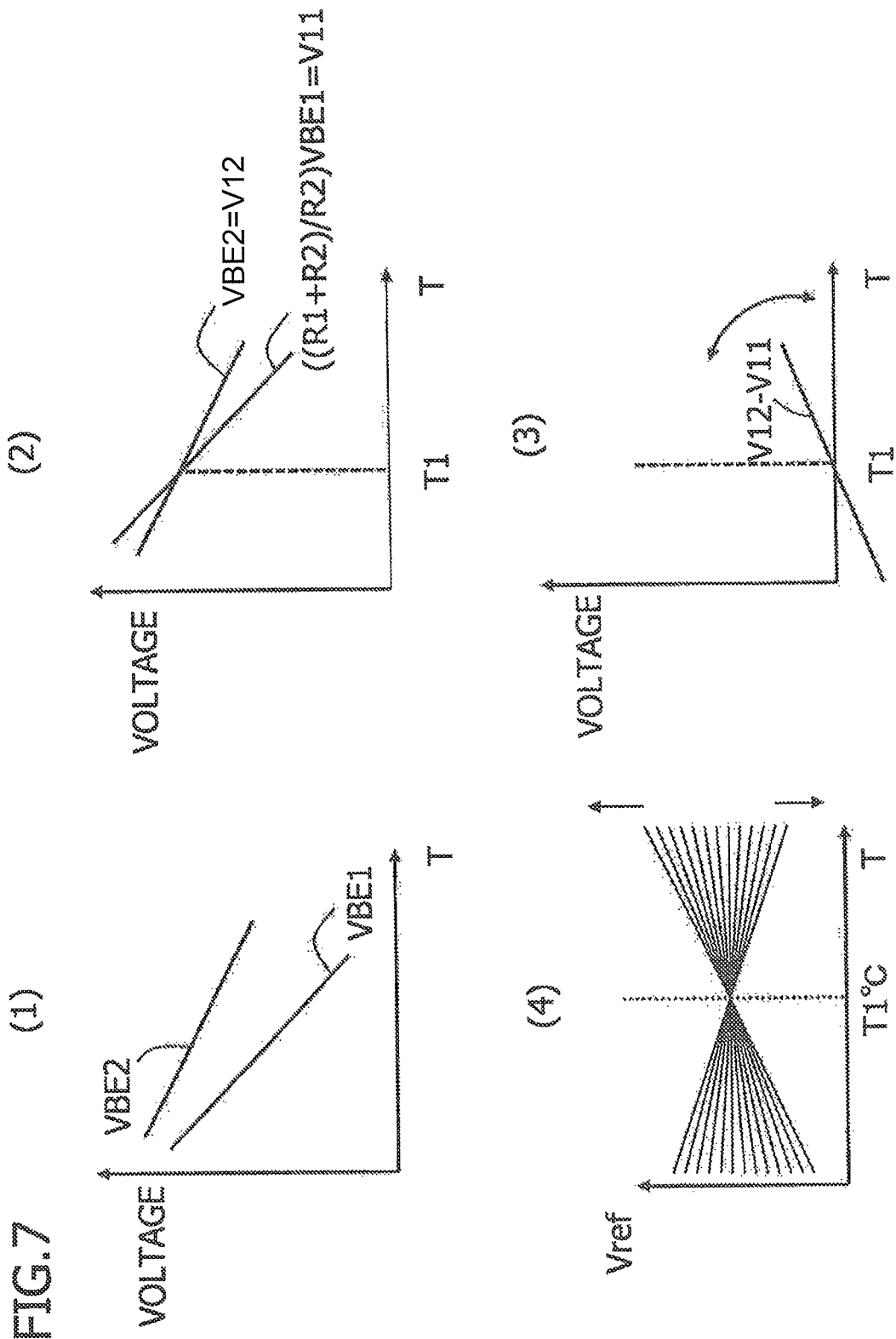

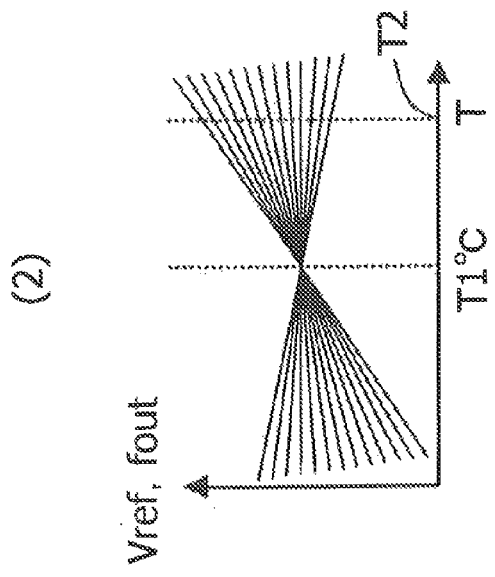
FIG.8 (1)
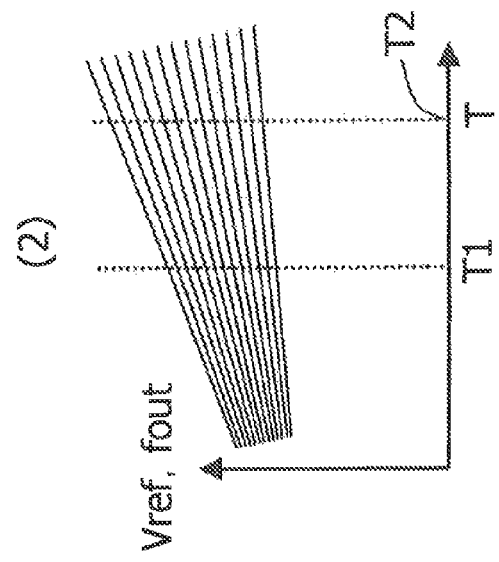
FIG.8 (2)
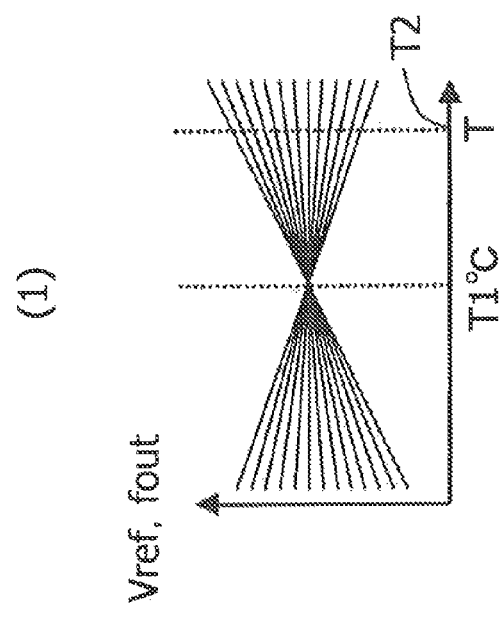
FIG.9 (1)
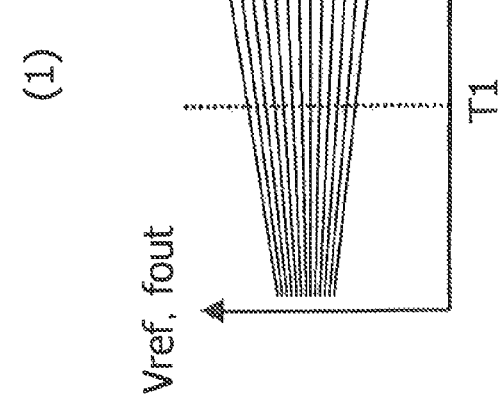
FIG.9 (2)

REFERENCE VOLTAGE GENERATION CIRCUIT, OSCILLATION CIRCUIT INCLUDING THE SAME AND METHOD FOR CALIBRATING OSCILLATION FREQUENCY OF OSCILLATION CIRCUIT

CROSS-REFERENCE TO RELATED APPLICATION

This application is based upon and claims the benefit of priority of the prior Japanese Patent Application No. 2012-003115, filed on Jan. 11, 2012, the entire contents of which are incorporated herein by reference.

FIELD

The present invention relates to a reference voltage generation circuit, an oscillation circuit including the same and a method for calibrating an oscillation frequency of the oscillation circuit.

BACKGROUND

A reference voltage generation circuit generates a reference voltage corresponding to a desired temperature characteristic. As the reference voltage generation circuit, a band gap reference circuit is generally known. The band gap reference circuit (hereafter BGR circuit) generates a constant voltage against a temperature change by adding a voltage having a positive temperature characteristic to a voltage having a negative temperature characteristic. The BGR circuit is described in patent document, International Publication WO 2008/120350, for example.

On the other hand, in regard to an oscillation circuit, there is known an RC oscillation circuit including inverters of odd-numbered stages and an R, C circuit disposed on an inverter output node, as described in patent document, Japanese Laid-open Patent Publication No. 2008-252414, for example. As a clock source provided internally in an LSI, it is generally configured of an external crystal oscillator and a frequency division circuit which is disposed internally in the LSI for frequency dividing highly accurate clocks generated by the crystal oscillator. Further, as a technique without using a crystal oscillator, it has been proposed to form an oscillation circuit internally in an LSI, so as to be used for an internal clock source.

A power regulator generates and supplies internal power to the oscillation circuit incorporated in the LSI, based on a reference voltage generated by a reference voltage generation circuit such as a BGR circuit. In general, an internal power supply provides a constant voltage without temperature dependence. Therefore, the reference voltage generation circuit outputs a constant voltage without temperature dependence as the reference voltage.

To an LSI of recent years, various kinds of specifications are desired. For example, corresponding to the fast operation of a transistor incorporated in the LSI at a high temperature, there is wanted fast processing by raising the frequency of the oscillation circuit, or oppositely, suppression of increased power consumption which accompanies fast operation of the incorporated transistor at a high temperature, by decreasing the frequency of the oscillation circuit.

SUMMARY

An embodiment of the reference voltage generation circuit has a first PN junction element having a first forward direction voltage; a second PN junction element having a different current density from the first PN junction element and having a second forward direction voltage higher than the first forward direction voltage; a first differential amplifier having a first input configured to be connected to an anode of the first PN junction element and a second input configured to be connected to a first connection node between a first and a second resistor disposed in series between a first output of the first differential amplifier and a first potential, and configured to generate a first output voltage at the first output; and a second differential amplifier having a first input configured to be connected to an anode of the second PN junction element and a second input configured to be connected to a second connection node between a fourth and a third resistor disposed in series between a second output of the second differential amplifier and the first output of the first differential amplifier, and configured to generate a reference voltage at the second output. And a resistance ratio between the third and the fourth resistors is variable The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 is the circuit diagram of a reference voltage generation circuit according to a first embodiment.

FIG. 7 is a diagram illustrating the characteristic of the reference voltage generation circuit.

FIG. 8 is a diagram illustrating a method for setting the temperature characteristic of a frequency in an oscillation circuit according to the present embodiment.

FIGS. 9 (1), (2) are diagrams illustrating the temperature characteristic of a reference voltage Vref generated by a general band gap reference circuit, and also the temperature characteristic of a frequency fout of an oscillator corresponding to the reference voltage Vref.

DESCRIPTION OF EMBODIMENTS

Figure 1:
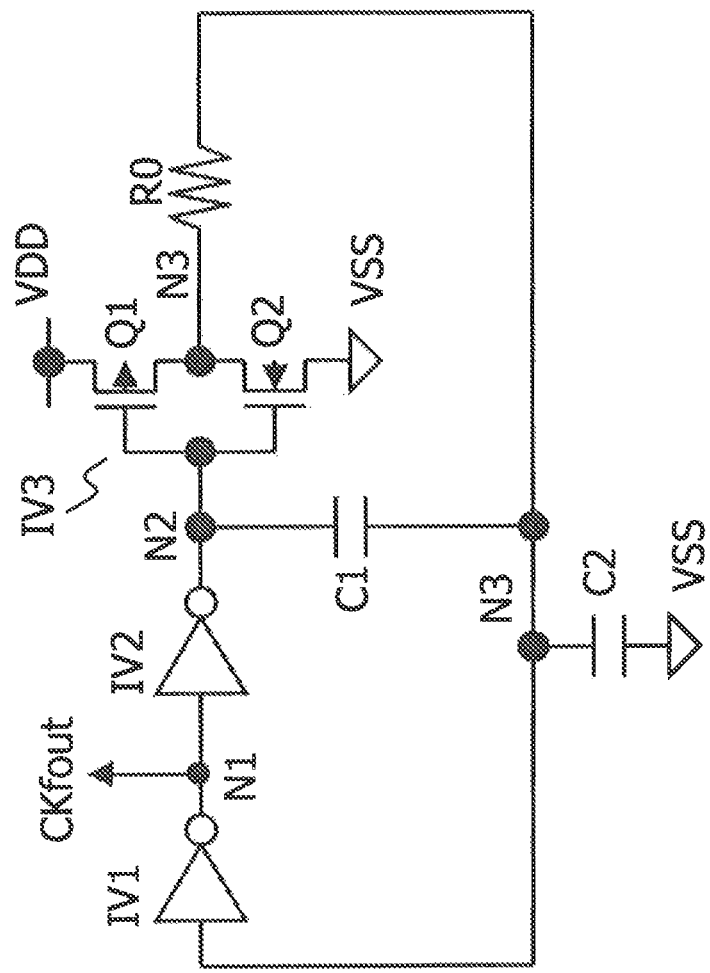
FIG. 1 is a diagram illustrating an example of an oscillator.

FIG. 1 is a diagram illustrating an example of an oscillator. The exemplary oscillator depicted in FIG. 1 includes a plurality of, typically odd-numbered inverters IV1, IV2, IV3 connected in a ring shape, and a resistor R0 and capacitors C1, C2 disposed at an output node of either one of the inverters, which is an output node N3 of the inverter IV3 in FIG. 1. The inverter IV3 includes a P-channel MOS transistor Q1 and an N-channel MOS transistor Q2 which are disposed between a power voltage VDD and a ground VSS. The other inverters IV1, IV2 are of identical configuration to the inverter IV3. Also, in the example of FIG. 1, an output clock CKfout, an oscillation clock, is output from an output node N1 of the inverter IV1.

Figure 2:
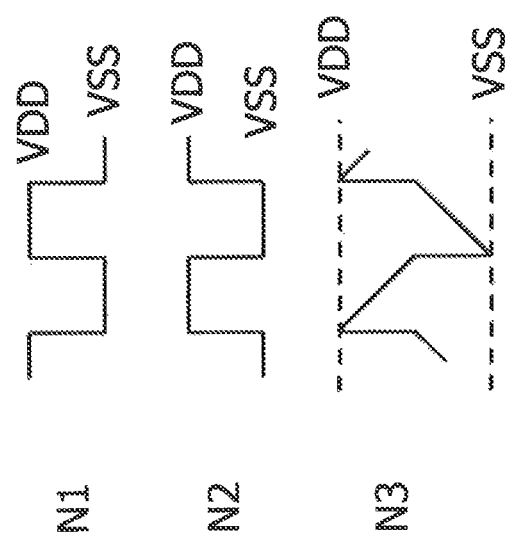
FIG. 2 is a diagram illustrating oscillation operation of the CR oscillator depicted in FIG. 1.

FIG. 2 is a diagram illustrating oscillation operation of the CR oscillator depicted in FIG. 1. The output node N1 of the inverter IV1 and an output node N2 of the inverter IV2 output a clock signal which repeats the H level of the power voltage VDD and the L level of the ground VSS of mutually opposite phases. On the other hand, in response to a rise of the output node N2 from the L level to the H level, the output of the output node N3 gradually decreases from the H level to the L level with an integral waveform by a CR time constant. When the output node N3 comes to have a voltage lower than VDD/2 which is a threshold voltage of the inverter IV1, the output node N1 of the inverter IV1 is reversed from the L level to the H level, and the output node N2 of the inverter IV2 is reversed from the H level to the L level. Also, the voltage of the output node N3 is decreased from VDD/2 to the L level by a capacitive coupling of the capacitor C1.

Oppositely, in response to a fall at the output node N2 from the H level to the L level, the output node N3 of the inverter IV3 has a voltage increasing from the L level to the H level with an integral waveform by the CR time constant. Then, when the output node N3 comes to have a higher voltage than VDD/2, the inverters IV1, IV2 are reversed, and the output node N3 rises from VDD/2 to the H level by the capacitive coupling of the capacitor C1.

In general, the oscillation frequency of the CR oscillator is proportional to the inverse number of the CR time constant. Namely, an oscillation frequency fout of an output clock CKfout is expressed as follows.

$$fout \propto VCR = 1/R0(C1+C2)$$

On the other hand, in the CR oscillator depicted in FIG. 1, the rise and the fall at the output node N3 by the CR time constant are limited to VDD/2 by the provision of the coupling capacitor C1, Further, in consideration of a propagation delay time Tpd in the three inverters IV1-IV3, the oscillation frequency fout is expressed as follows.

$$fout = 1/\{2*R0*(C1+C2)*LN(2)+Tpd\} \quad (1)$$

where LN(2) is a natural logarithm.

When the frequency is so sufficiently low that the propagation delay time Tpd in the inverters is negligible, the oscillation frequency fout in the above expression (1) is approximated as follows.

$$fout = 1/\{2*R0*(C1+C2)*LN(2)\}$$

Therefore, the frequency is independent of the power voltage VDD.

However, when the frequency is high, the propagation delay time Tpd in the inverters is not negligible, and the oscillation frequency fout is as described in expression (1). In this case, the propagation delay time Tpd in the inverters depends on the characteristics of the transistors Q1, Q2 constituting each inverter. As the power voltage VDD is higher, an ON resistance in the transistor characteristics becomes lower, the propagation delay time in the inverters becomes shorter and the oscillation frequency becomes higher. Further, also in the case that the temperature rises, the propagation delay time in the inverters becomes shorter, and the oscillation frequency becomes higher.

Figure 3:
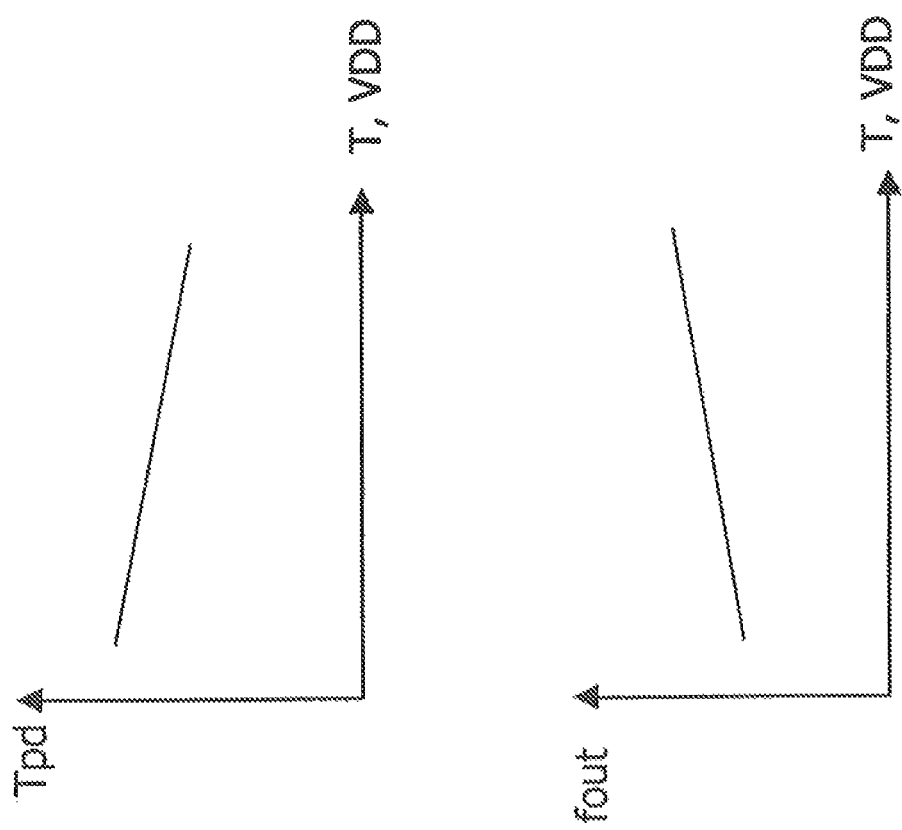
FIG. 3 is a diagram illustrating the temperature characteristic and the power voltage characteristic of the oscillator which generates a high frequency clock to such an extent that the propagation delay time Tpd in the inverters becomes not negligible.

FIG. 3 is a diagram illustrating the temperature characteristic and the power voltage characteristic of the oscillator which generates a high frequency clock to such an extent that the propagation delay time Tpd in the inverters becomes not negligible. In FIG. 3, there are depicted the characteristics of both the propagation delay time Tpd in the inverters and the oscillation frequency fout, relative to a temperature T and a power voltage VDD.

The propagation delay time Tpd varies with a negative inclination relative to the temperature T, and to the power voltage VDD also. As a result, because the oscillation frequency fout of the oscillator is inversely proportional to the propagation delay time Tpd and the CR time constant, the oscillation frequency fout varies with a positive inclination relative to the temperature T, and to the power voltage VDD also.

According to the temperature characteristic and the power voltage characteristic depicted in FIG. 3, it is possible to obtain a constant oscillation frequency relative to the temperature T by controlling the oscillation frequency fout, which varies with a positive inclination relative to the temperature T, by the power voltage VDD which varies with a negative inclination relative to the temperature T. Further, if it is possible to control the inclination of the power voltage VDD relative to the temperature T to have either a negative or a positive arbitrary inclination, it is possible to set the variation of the oscillation frequency relative to the temperature T to have either a positive or a negative inclination, and with an arbitrary degree of inclination.

Accordingly, the present embodiment provides a reference voltage generation circuit capable of setting a reference voltage relative to a temperature T to have an arbitrary inclination with a small man-hour, and provides an oscillator capable of setting an oscillation frequency to either a positive or a negative inclination relative to the temperature T and with an arbitrary inclination, by use of the above reference voltage generation circuit.

Oscillation Circuit According to the Present Embodiment

Figure 4:
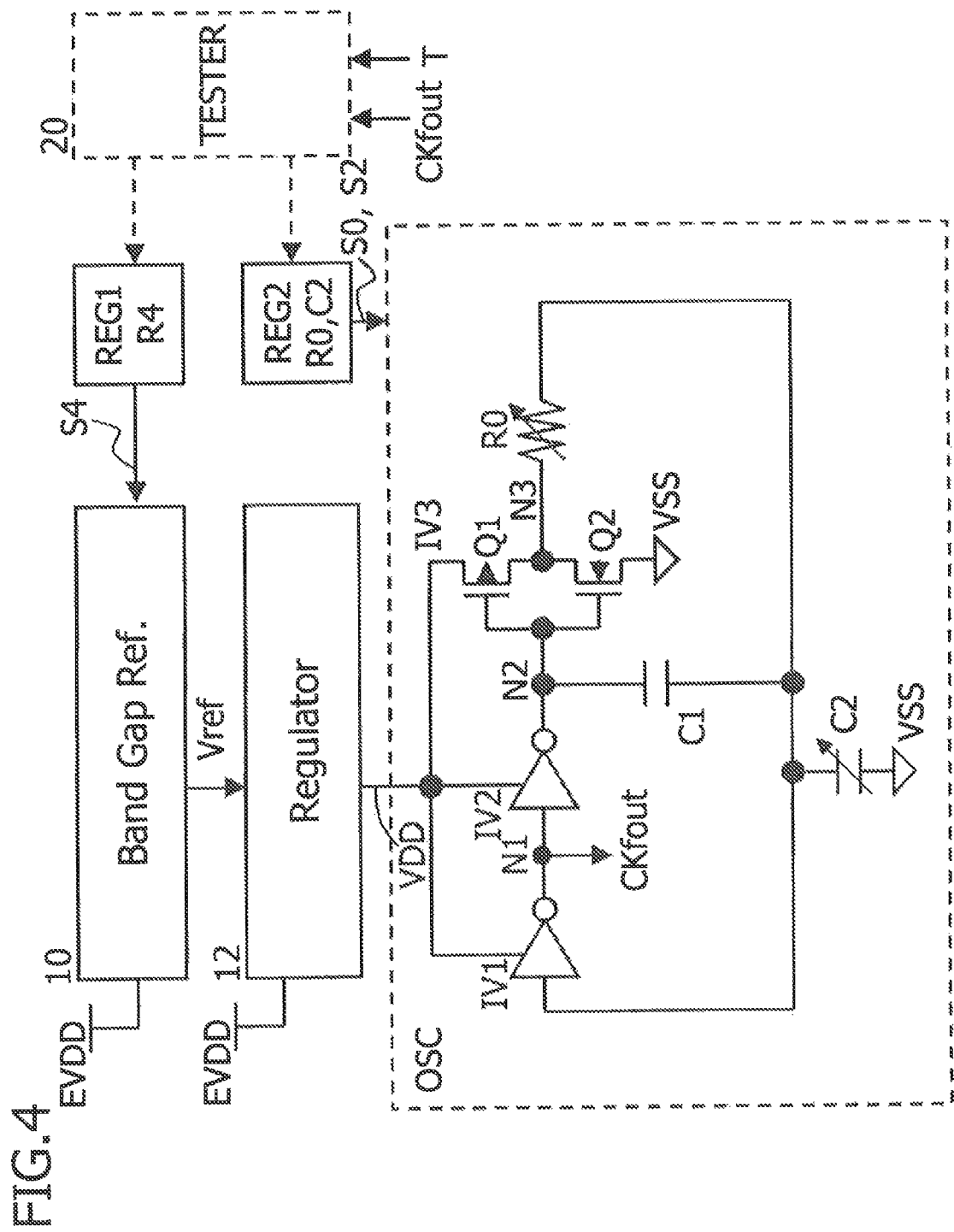
FIG. 4 is the configuration diagram of an oscillation circuit according to the present embodiment.

FIG. 4 is the configuration diagram of an oscillation circuit according to the present embodiment. The oscillation circuit includes: a reference voltage generation circuit 10, which is supplied with the first power EVDD, generates a reference voltage Vref having a desired temperature characteristic; a power regulator 12 which is connected to the first power EVDD to generate second power VDD having a prescribed voltage based on the reference voltage Vref; and an oscillator OSC to which the second power VDD is supplied.

The reference voltage generation circuit 10 is, for example, a band gap reference circuit, and includes a correction function capable of setting to the reference voltage Vref a desired inclination relative to temperature. A desired temperature characteristic for the reference voltage is set by a set signal S4 stored in a register REG1. Accompanying thereto, the voltage of the second power VDD, generated by the power regulator 12 on the basis of the reference voltage Vref, also comes to include a desired temperature characteristic.

Similar to FIG. 1, the oscillator OSC includes a plurality of, typically odd-numbered, inverters IV1, IV2, IV3 and an RC circuit disposed at the output node N3 of the inverter IV3. To the three inverters, second power VDD is supplied. The RC circuit includes a resistor R0 and capacitors C1, C2. In the example depicted in FIG. 4, one or both of the resistor R0 and the capacitor C2 are variably settable, in which variable setting is made by set signals S0, S2 which are set in a register REG2. Excluding that the resistor R0 and the capacitor C2 are variably settable, the circuit configuration of the oscillator OSC is identical to that of the oscillator depicted in FIG. 1.

According to the present embodiment, a tester 20 outside an LSI monitors both an oscillation frequency fout of an output clock CKfout from the oscillator OSC and a temperature T, and while monitoring, the tester 20 sets set signals S4, S0, S2 in the registers REG1, REG2 so that the frequency provides a desired inclination characteristic relative to the temperature T.

As explained in FIG. 3, the propagation delay time Tpd in the inverters of the oscillator OSC has a temperature characteristic including a negative inclination relative to the temperature T. Accordingly, the frequency of the oscillator OSC has a temperature characteristic with a positive inclination relative to the temperature T. On the other hand, the propagation delay time in the inverters has a characteristic also including a negative inclination relative to the second power voltage VDD. Therefore, the oscillator frequency rises if the voltage of a second power voltage VDD rises, and the oscillator frequency falls if the voltage thereof falls, and thus, the oscillator frequency provides a positive inclination characteristic relative to the second power voltage VDD.

Figure 5:
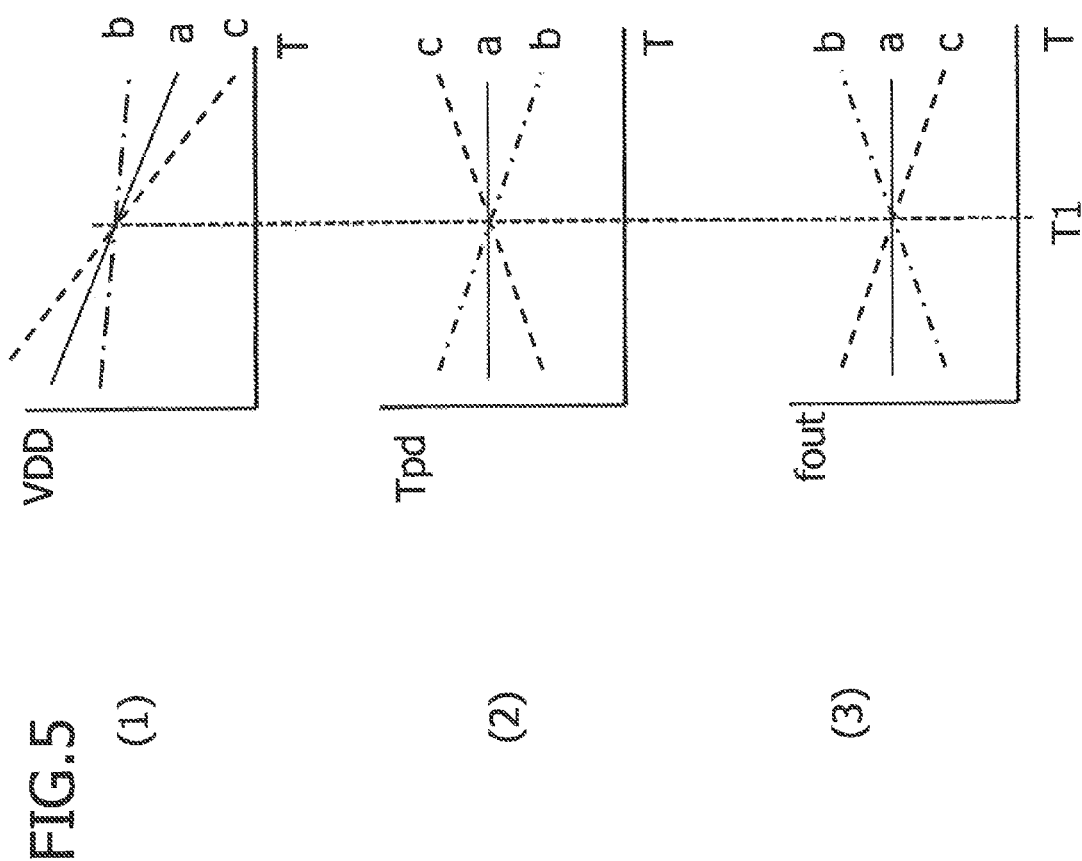
FIG. 5 is a diagram illustrating a temperature characteristic of the oscillation circuit depicted in FIG. 4.

FIG. 5 is a diagram illustrating a temperature characteristic of the oscillation circuit depicted in FIG. 4. In FIG. 5, there are depicted the characteristics of the second power voltage VDD, the propagation delay time Tpd in the inverters and the frequency fout, relative to the temperature T. As depicted in FIG. 3, the propagation delay time Tpd has a negative inclination relative to the temperature T, and accordingly, as depicted in FIG. 5 (1), if the second power voltage VDD is made to have a characteristic (a) including a negative inclination relative to the temperature T, it is possible for the propagation delay time Tpd to have a characteristic (a) having a constant value to the temperature T, as depicted in FIG. 5 (2). Also, for the frequency fout, it is possible to have a characteristic (a) having a constant value to the temperature T, as depicted in FIG. 5 (3). Because the temperature characteristic of the second power voltage VDD is identical to that of the reference voltage Vref, the characteristic of the second power voltage VDD depicted in FIG. 5 (1) is achievable by the setting of the temperature characteristic of the reference voltage Vref in the reference voltage generation circuit.

Further, if the negative inclination characteristic of the second power voltage VDD relative to the temperature T is set to be a characteristic (c) having a steeper negative inclination than the characteristic (a), the propagation delay time Tpd depicted in FIG. 5 (2) comes to have a characteristic (c) including a positive inclination relative to the temperature T. Accordingly, the frequency fout depicted in FIG. 5 (3) comes to have a characteristic (c) including a negative inclination relative to the temperature T.

In contrast, if the negative inclination characteristic of the second power voltage VDD relative to the temperature T is set to be a characteristic (b) having either a gentler inclination than the characteristic (a) or a positive inclination, the propagation delay time Tpd depicted in FIG. 5 (2) comes to have a characteristic (b) including a negative inclination relative to the temperature T. Accordingly, the frequency fout depicted in FIG. 5 (3) comes to have a characteristic (b) including a positive inclination relative to the temperature T. This is identical to the characteristic depicted in FIG. 3.

As such, by the adjustment of the temperature characteristic of the reference voltage Vref, it is possible to set the characteristic of the frequency fout relative to the temperature T to have any one of a positive inclination (b), a negative inclination (c) or a constant value (a).

[Reference Voltage Generation Circuit According to First Embodiment]

FIG. 6 is the circuit diagram of a reference voltage generation circuit according to a first embodiment. Also, FIG. 7 is a diagram illustrating the characteristic of the reference voltage generation circuit. A band gap reference circuit 10, which is the reference voltage generation circuit depicted in FIG. 6, includes a first and a second PN junction element D1, D2, a first differential amplifier A1 and a second differential amplifier A2.

The first and second PN junction elements D1, D2 are diodes each of which is a PNP bipolar transistor with the base and the collector being short-circuit, namely a PN junction element formed of an emitter-base PN junction of the bipolar transistor. The emitter area (M=2) of the first PN junction element D1 is two times as large as the emitter area (M=1) of the second PN junction element D2.

By an NMOS transistor Q10 and PMOS transistors Q11, Q12 and Q13, prescribed currents I1, I2 are generated in the first and second PN junction elements D1, D2. More specifically, a prescribed bias voltage Vbias is supplied to the gate of the NMOS transistor Q10, while the source thereof is connected to the ground VSS, so that the NMOS transistor Q10 generates a current I0 corresponding to the bias voltage Vbias. The PMOS transistors Q11, Q12, Q13, whose sources are connected to a first power voltage EVDD and gates are connected in common, constitute a current mirror circuit. In the transistors Q12, Q13, the currents I1, I2 equal to the current I0 multiplied by the gate width ratio of the transistors Q12, Q13 to the transistor Q11 respectively flow. For example, if the gate widths of the transistors Q12, Q13 are set equal, the currents I1, I2 become equal. If the gate width of the transistor Q13 is set wider than that of the transistor Q12, the current I2 becomes larger than the current I1 according to the ratio thereof.

In the case of I1=I2 or I1<I2, a current density in the second PN junction element D2 becomes higher than a current density in the first PN junction element D1, because between the junction areas of the first and second PN junction elements D1, D2, D1>D2 holds. In the PN junction, the larger the current density is, the larger a forward direction voltage VBE becomes, with a gentler negative inclination relative to the temperature T. Therefore, as depicted in FIG. 7 (1), a second forward direction voltage VBE2 is larger than a first forward direction voltage VBE1, and VBE2 has a gentler negative inclination relative to the temperature T than VBE1. The above difference of the forward direction voltage and the difference of the inclination are caused by the difference of the current densities.

In FIG. 6, to a positive electrode input of the first differential amplifier A1, the first forward direction voltage VBE1 is input, and also, to a negative electrode input, a connection node V10 of resistors R1, R2, which are disposed between an output voltage V11 of the first differential amplifier A1 and the ground VSS, is input. Because both input voltages are made equal (V10=VBE1) by the differential amplifier A1, the output voltage V11 becomes as follows.

$$V11 = \{(R1+R2)/R2\} * VBE1 \qquad (2)$$

The above output voltage V11 is a voltage level of the first forward direction voltage VBE1 depicted in FIG. 7 (1) increased by (R1+R2)/R2 times, and includes a temperature characteristic which intersects with the second forward direction voltage VBE2 at a prescribed temperature T1, as depicted in FIG. 7 (2). The temperature T1 which produces the intersection depends on the resistance values of the resistors R1, R2. As an example, preferably, the resistance values of the resistors R1, R2 are selected such that the temperature T1 is within the room temperature range.

Further, in FIG. 6, to a positive electrode input of the second differential amplifier A2, the second forward direction voltage VBE2 is input, and also, to a negative electrode input, a connection node V12 of resistors R4, R3, which are disposed in series between the output reference voltage Vref and the output voltage V11 of the first differential amplifier A1, is input. Thus, because a difference voltage V12-V11 between V12 and V11 is applied to the resistor R3, a voltage of the difference voltage V12-V11 multiplied by the resistance ratio R4/R3 of the resistors R4, R3 is applied to the resistor R4 which is connected in series with the resistor R3. Here, V12=VBE2 holds because both inputs have an equal voltage by the operation of the differential amplifier A2. Therefore, the output reference voltage Vref becomes as follows, $$Vref=VBE2+(R4/R3)*[V12-V11] \quad (3)$$

Further, from V12=VBE2 and the voltage V11 in expression (2), the reference voltage Vref becomes as follows.

$$Vref=VBE2+(R4/R3)*[VBE2-\{(R1+R2)/R2\}*VBE1] \quad (4)$$

In the above expressions (3), (4), V12-V11, that is, VBE2-V11 includes a temperature characteristic having a positive inclination shifting from negative to positive at the temperature T1, as depicted in FIG. 7 (3). Also, (R4/R3)*[V12-V11] includes a temperature characteristic whose positive inclination is varied according to the resistance ratio R4/R3 of the resistors R4 and R3.

Accordingly, because the reference voltage Vref in the expressions (3), (4) is a sum of the negative inclination characteristic of the second forward direction voltage VBE2 depicted in FIG. 7 (1) and the positive inclination characteristic of (R4/R3)*[V12−V11] depicted in FIG. 7 (3), the temperature characteristic of the reference voltage Vref varies from a positive inclination to a negative inclination according to the resistance ratio R4/R3, centering a constant voltage at the temperature T1. In other words, the temperature characteristic of the reference voltage Vref, as depicted in FIG. 7 (4), has an inclination relative to the temperature which depends on the resistance ratio R4/R3 of the resistors R4, R3, centering a constant voltage at an arbitrary temperature T1 by appropriately designing the resistance values of the resistors R1, R2 in the band gap reference circuit 10.

FIG. 8 is a diagram illustrating a method for setting the temperature characteristic of a frequency in an oscillation circuit according to the present embodiment. As depicted in FIG. 7 (4), the reference voltage Vref has a temperature characteristic having an inclination depending on the resistance ratio R4/R3, centering the constant voltage at the prescribed temperature T1. If the reference voltage Vref is high, the propagation delay time Tpd in the inverters of the oscillator becomes short, and the frequency fout becomes high. Therefore, the oscillation frequency fout comes to have an identical temperature characteristic to the reference voltage Vref. FIG. 8 (1) illustrates that the reference voltage Vref and the frequency tout come to have an identical temperature characteristic to the temperature T.

However, when relative variation of the resistors R3, R4 is generated due to variation in manufacturing, the resistance ratio R4/R3 varies. Namely, as depicted in FIG. 8 (2), because of manufacturing variation, if the resistance ratio R4/R3 becomes greater than an expected value, the characteristic depicted in FIG. 8 (1) varies to a counterclockwise direction.

Therefore, according to the present embodiment, in the oscillation circuit depicted in FIG. 4, the temperature characteristic of the frequency is calibrated in the following manner.

(1) First, with a temperature set to be T1° C., by variably controlling the resistor R0 or the capacitor C2 in the oscillator OSC while monitoring the frequency fout, a set value to be set as the resistance value of the resistor R0 or the capacitance value of the capacitor C2 is searched for to produce a desired frequency value fout. The set value is then stored into the register REG2. Because the temperature is T1° C., the reference voltage Vref comes to have a fixed voltage, irrespective of the value of the resistance ratio R4/R3. In other words, by setting the resistor R0 and the capacitor C2 in the oscillator OSC, it is possible to set the fixed frequency at the temperature T1 to a desired frequency depicted in FIGS. 8 (1) and (2).

(2) Secondly, in a state that a temperature T2 different from T1 is set, by varying the resistance value of, for example, the fourth resistor R4 in the reference voltage generation circuit 10 while monitoring the frequency fout, a set value of the resistor R4 to produce the desired frequency is searched for, and the set value is stored into the register REG1. As depicted in FIG. 8 (2), due to the manufacturing variation of the resistance ratio R4/R3, the temperature characteristic of the frequency fout may vary to a clockwise direction or to a counterclockwise direction opposite thereto, as depicted in FIG. 8 (2). Therefore, by measuring the frequency fout for each set value of the resistor R4 at the temperature T2 different from the temperature T1, and confirming the temperature characteristic, the set value of the resistor R4 producing the desired temperature characteristic is set into the register REG1. Here, instead of making the resistance value of the fourth resistor R4 variable, it may also be possible to make the resistance value of the third resistor R3 variable, or the resistance ratio R4/R3 of the resistors R3, R4 variable.

FIGS. 9 (1), (2) are diagrams illustrating the temperature characteristic of a reference voltage Vref generated by a general band gap reference circuit, and also the temperature characteristic of a frequency fout of an oscillator corresponding to the reference voltage Vref. According to the temperature characteristics depicted in FIGS. 9 (1), (2), the reference voltage Vref does not become a constant voltage at the temperature T1. Therefore, in the calibration step, in order to detect the entire temperature characteristics, measurement is performed on each reference voltage Vref (or frequency fout) corresponding to each of the entire set values at the temperature T1, and also on each reference voltage Vref (or frequency fout) corresponding to each of the entire set values at a temperature T2 different from the temperature T1. Then, in order to perform setting to satisfy that (1) first, a desired reference voltage Vref (or frequency fout) is produced at the temperature T1, and (2) secondly, a desired temperature characteristic is produced, it is necessary to repeat the steps of: setting the frequency of (1) by variably setting the set value of the oscillator; thereafter, setting the temperature characteristic of (2); and then setting the frequency of (1) again.

In contrast, according to the present embodiment, it is sufficient to perform the setting of (1) and the setting of (2) described in FIG. 8 one time for each. Thus, the man-hour of the calibration step may be reduced, so that a calibration cost may be reduced.

The variable resistor R4 in the reference voltage generation circuit depicted in FIG. 6 may be configured of a plurality of resistance elements and a plurality of switches disposed at the connection nodes thereof. By controlling the plurality of switches ON and OFF by set signals, it is possible to set the temperature characteristic of the reference voltage Vref to be a desired temperature characteristic. Normally, each of such a switch is configured of a CMOS transfer gate having PMOS and NMOS transistors connected in parallel.

Here, in order to suppress a leak current in an OFF state while internal power is decreased by a decreased gate breakdown voltage accompanying to the miniaturization of an LSI device, a design to raise the threshold voltage of a MOS transistor is generally adopted. In such a case, the threshold voltage is increased while the gate breakdown voltage is reduced, which makes it difficult to achieve complete ON operation of the CMOS transfer gate.

Therefore, it is desired to achieve variable setting of the variable resistor R4 in the reference voltage generation circuit, using a circuit other than the CMOS transfer gate.

Figure 10:
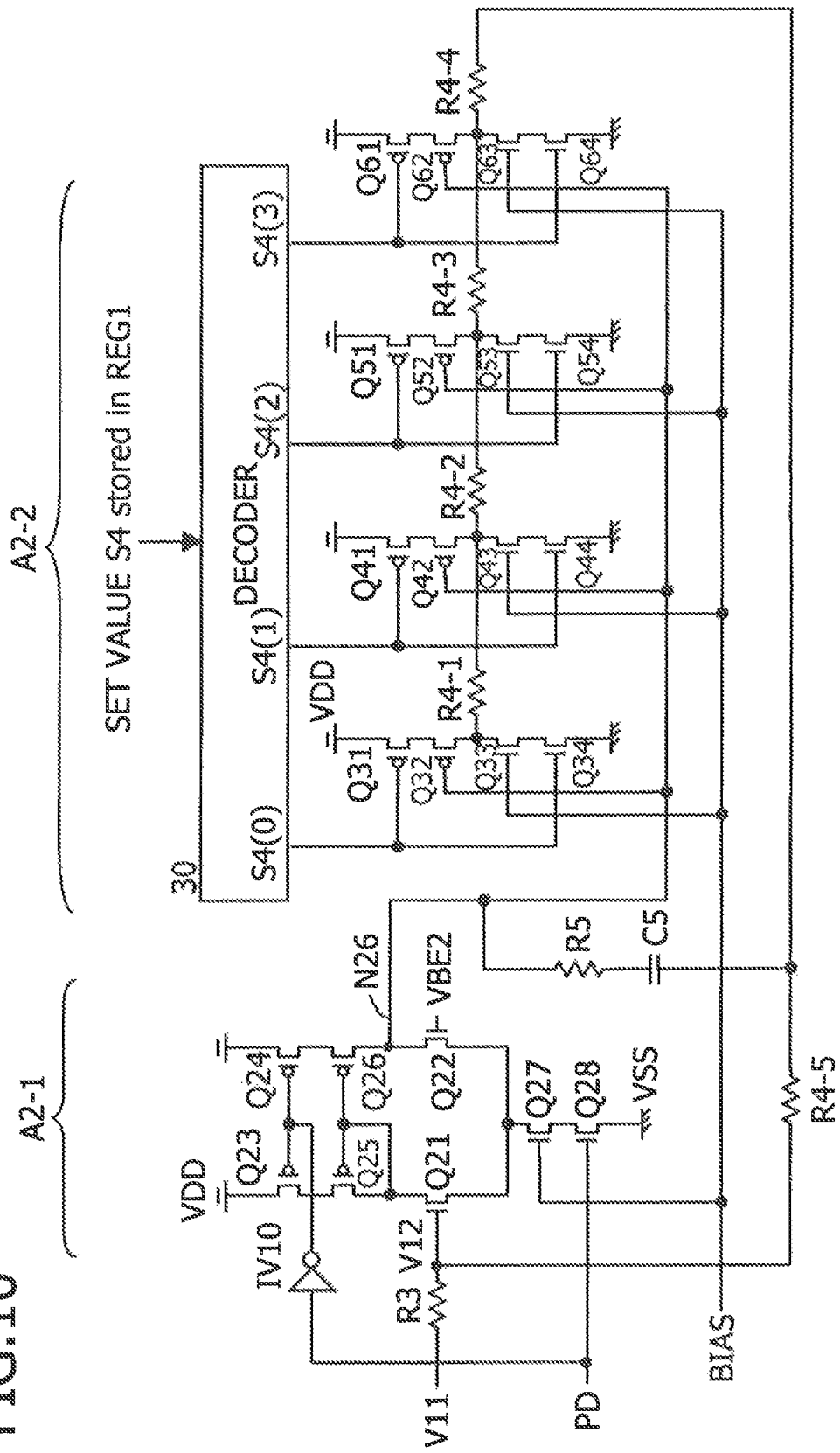
FIG. 10 is a circuit diagram of the second differential amplifier of the reference voltage generation circuit according to the present embodiment.

FIG. 10 is a circuit diagram of the second differential amplifier of the reference voltage generation circuit according to the present embodiment. The second differential amplifier depicted in FIG. 10 is capable of variably setting the resistance value of the resistor R4, without use of a CMOS transfer gate.

The second differential amplifier A2 includes: a pre-stage amplifier A2-1 for inputting the input voltages V12 and VBE2, and outputting to a node N26 an output voltage corresponding to a voltage difference between the above input voltages; and a post-stage amplifier A2-2 for further amplifying the output voltage of the node N26. The pre-stage amplifier A2-1 includes: NMOS transistors Q21, Q22 having gates to which the input voltages V12, VBE2 are applied, respectively; an NMOS transistor Q28 having a gate to which a power down signal PD is applied; PMOS transistors Q23, Q24 having gates to which the power down signal PD is applied through an inverter IV10; PMOS transistors Q25, Q26 constituting a current mirror circuit; and an NMOS transistor Q27, having a gate to which a bias voltage BIAS is applied and functioning as a current source, The pre-stage amplifier A2-1 is activated when the power down signal PD becomes the H level, and generates an output signal at the output node N26 according to a differential voltage between the input voltages V12, VBE2.

The post-stage amplifier A2-2 includes four stages of circuit units in parallel connection, each including: a PMOS transistor Q32 (Q42, Q52, Q62) t0 having a gate to which the output node N26 is supplied, to configure a source-grounded amplifier; an NMOS transistor Q33 (Q43, Q53, Q63) having a gate to which the bias voltage BIAS is supplied and becoming a current source transistor; and a pair of PMOS transistor Q31 (Q41, Q51, Q61) and NMOS transistor Q33 (Q43, Q53, Q63) having gates to which the output signal S4(0) (S4(1), S4(2), S4(3)) is supplied. Between the four-stage circuit units, there are provided a plurality of resistance elements R4-1, R4-2, R4-3, R4-4 and R4-5 constituting a fourth resistor R4.

A two-bit set value S4 stored in the register REG1 is input into a decoder 30, and according to the set value S4, either one of the four set signals S4(0), S4(1), S4(2), S4(3) is selected. The selected set signal becomes the L level, while the other set signals entirely become the H level. A circuit unit having the L-level set signal becomes an activated state, so as to amplify the output node N26 of the pre-stage amplifier A2-1. On the other hand, a circuit unit having the H-level set signal becomes an inactivated state, by which the connection node between the transistors Q32, Q33, for example, becomes an H impedance state.

Accordingly, when the output signal S4(0) is in the L level, the resistance value of the fourth resistor equals a sum of the resistance values of the resistance elements R4-1, R4-2, R4-3, R4-4 and R4-5, producing a largest resistance value. On the other hand, when the output signal S4(3) is in the L level, the resistance value of the fourth resistor equals a sum of the resistance values of the resistance elements R4-4 and R4-5, producing a smallest resistance value. As such, in the second differential amplifier A2 depicted in FIG. 10, the four resistance elements R4-1 to R4-4 in the fourth resistor are provided between the plurality of source-grounded amplifiers on the output stage, so that the resistance value of the fourth resistor is variably settable by the activation of only one source-grounded amplifier.

An output node which outputs the reference voltage Vref of the second differential amplifier depicted in FIG. 10 is the connection node of the transistors Q32, Q33, the connection node of the transistors Q42, Q43, the connection node of the transistors Q52, Q53 or the connection node of the transistors Q62, Q63 of the source-grounded circuit unit having been rendered activated. Further, the resistor R5 and the capacitor C5 are a resistor and a capacitor for phase compensation of a closed amplifier structure.

[Reference Voltage Generation Circuit According to Second Embodiment]

Figure 11:
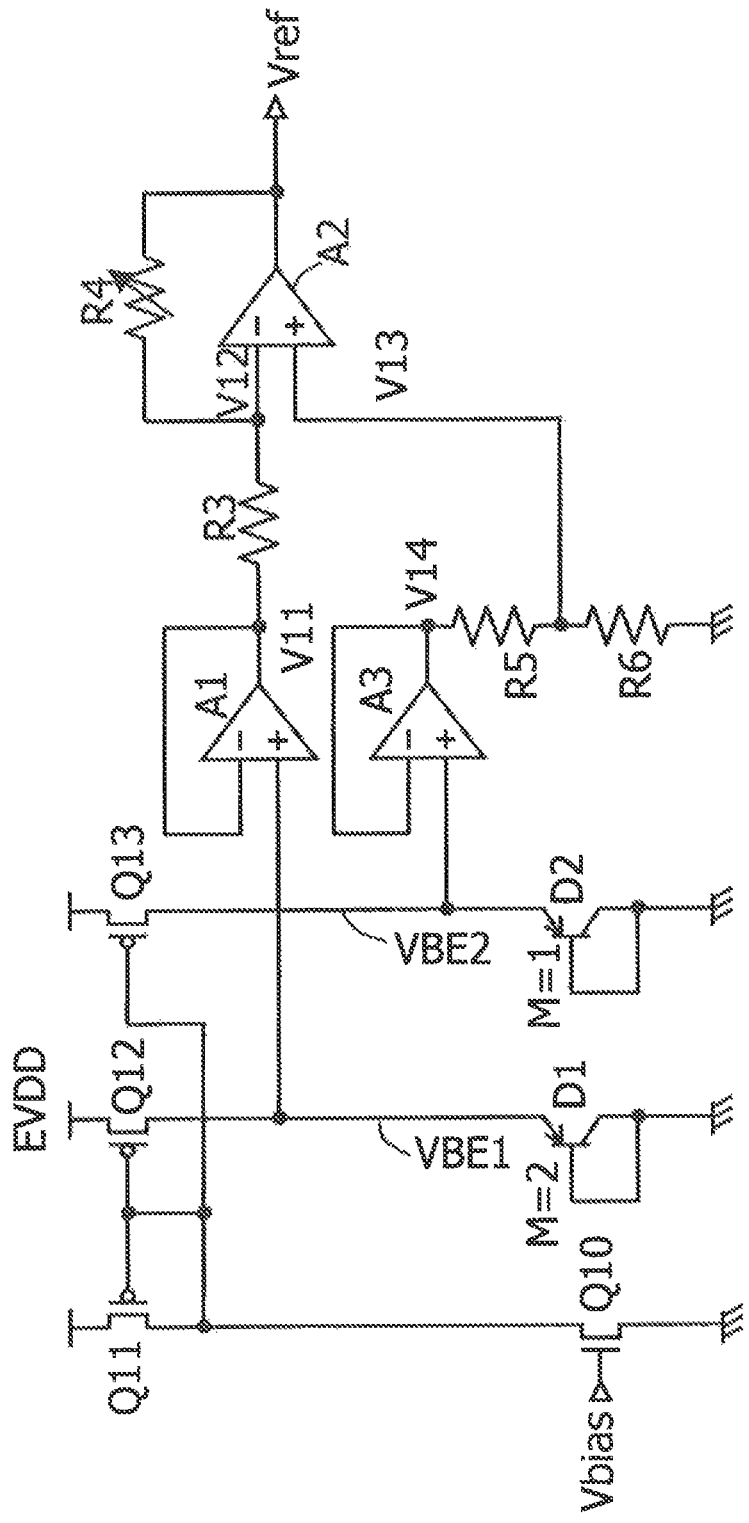
FIG. 11 is the diagram of a reference voltage generation circuit according to a second embodiment.

FIG. 11 is the diagram of a reference voltage generation circuit according to a second embodiment. Similar to the reference voltage generation circuit according to the first embodiment depicted in FIG. 6, the reference voltage generation circuit depicted in FIG. 11 includes an NMOS transistor Q10, PMOS transistors Q11, Q12, Q13, PN diodes D1, D2, resistors R3, R4 and a differential amplifier A2. Different from FIG. 6, in the reference voltage generation circuit depicted in FIG. 11, a first forward direction voltage VBE1 is input to the negative electrode input of the differential amplifier A2 through the differential amplifier A1 as a voltage V11, and through the resistor R3. Also, in regard to a second forward direction voltage VBE2, after decreased by R6/(R5+R6) times, a resistance ratio of the resistors R5, R6, through a differential amplifier A3, the voltage thus obtained is input to the positive electrode input of the differential amplifier A2, as a voltage V13 (={R6/(R5+R6)}VBE2).

Therefore, a reference voltage Vref generated by the reference voltage generation circuit depicted in FIG. 11 is as follows.

$$Vref = \overset{\text{negative temperature characteristic}}{\overline{\{R6/(R5+R6)\} * VBE2}} + \overset{\text{positive temperature characteristic}}{\overline{(R4/R3) * [\{R6/(R5+R6)\} * VBE2 - VBE1]}}$$

V12 = V13 (shift down VBE2)    V12 = V13 (shift down VBE2)

Figure 12:
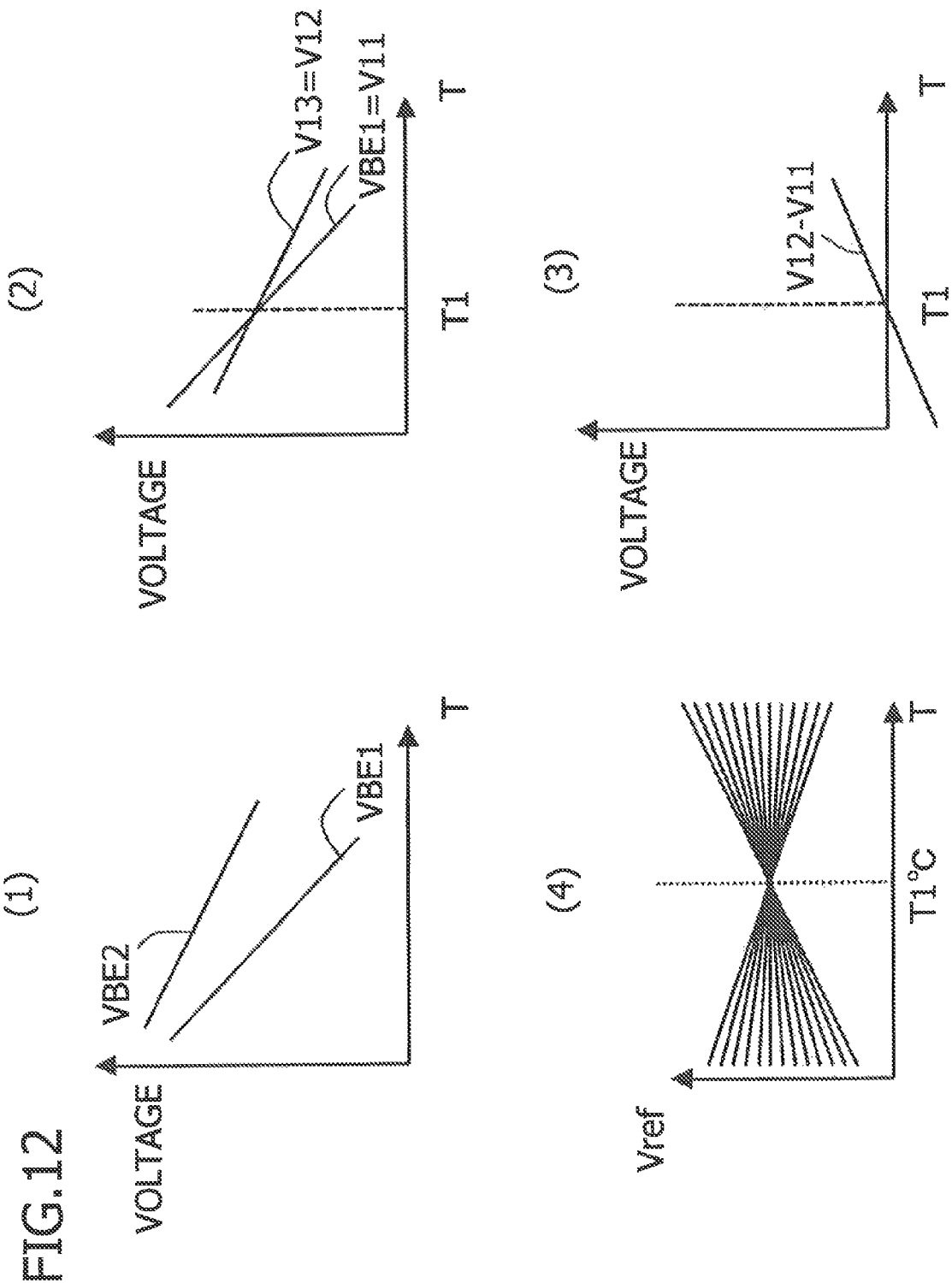
FIG. 12 is a diagram illustrating the temperature characteristic of the reference voltage generation circuit according to the second embodiment.

As represented in the above expression, by the differential amplifier A3 configured to generate V13 having a negative temperature characteristic and by V12-V11(VBE1) having a positive temperature characteristic, the reference voltage Vref is settable to have any one of a positive temperature characteristic, a negative temperature characteristic and no temperature characteristic, according to the resistance ratio R4/R3, FIG. 12 is a diagram illustrating the temperature characteristic of the reference voltage generation circuit according to the second embodiment. In the example depicted in FIG. 6, by increasing the first forward direction voltage VBE1, there is produced intersection with the temperature characteristic of the second forward direction voltage VBE2 at the temperature T1. In contrast, in the example depicted in FIG. 11, the second forward direction voltage VBE2 is decreased by the differential amplifier A3 and the resistors R5, R6 (V13−V12= (V6/(V5+V6))*VBE2), and the decreased voltage V13 is intersected with the temperature characteristic of the first forward direction voltage VBE1 (=V11) at the temperature T1. Therefore, the voltage V12-V11 applied to the resistor R3 becomes identical to the case of FIG. 6. As a result, also in FIG. 11, the degree of a positive inclination in the temperature characteristic of the voltage V12-V11 depicted in FIG. 12 (3) is variably settable according to the setting of the resistance ratio R4/R3. Thus, similar to FIG. 7 (4), by the setting of the resistance ratio R4/R3, it is possible to obtain the temperature characteristic of the reference voltage Vref having an arbitrary positive (with large R4/R3) or a negative inclination (with small R4/R3).

[Reference Voltage Generation Circuit According to Third Embodiment]

Figure 13:
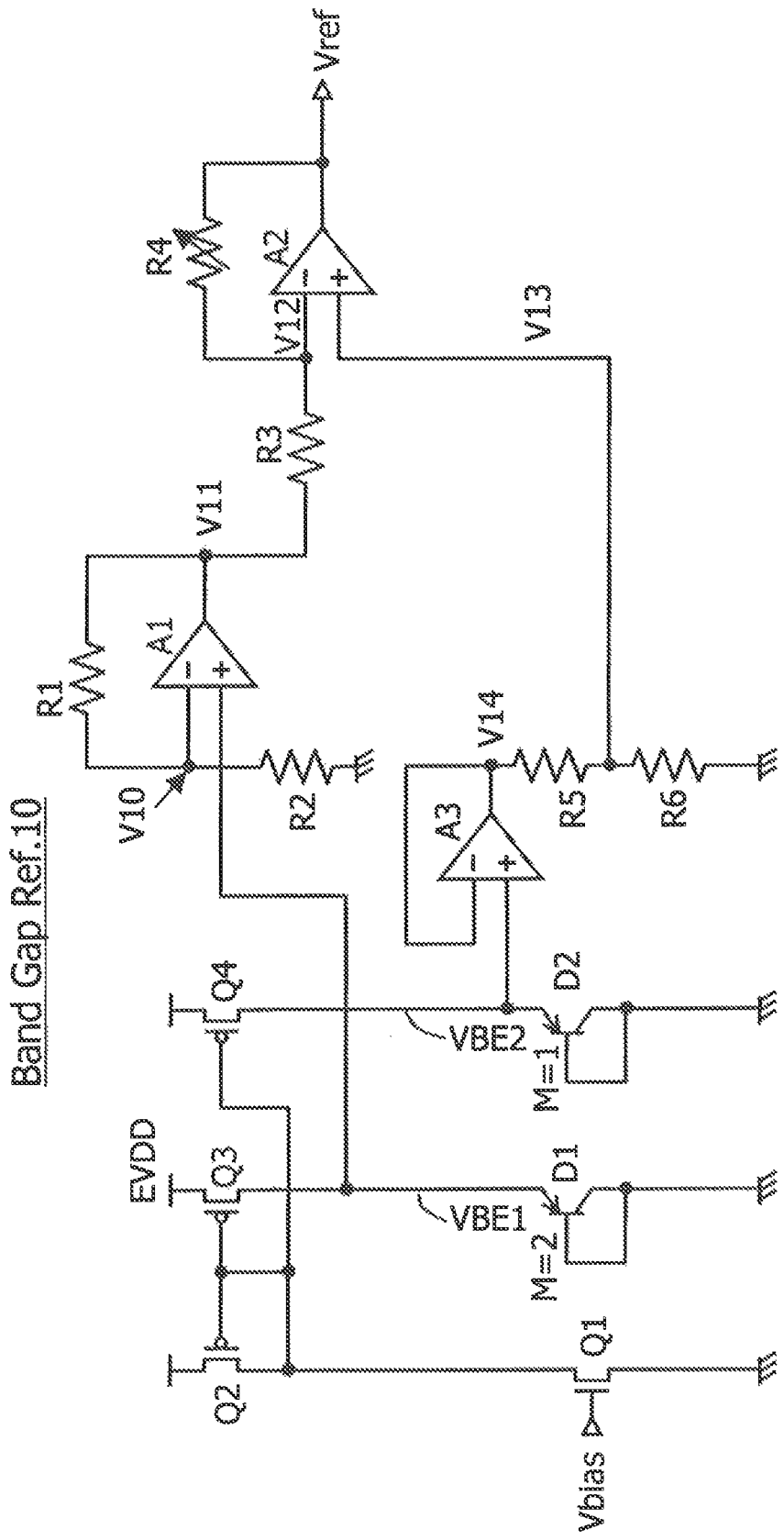
FIG. 13 is the diagram of a reference voltage generation circuit according to a third embodiment.

FIG. 13 is the diagram of a reference voltage generation circuit according to a third embodiment. Similar to the reference voltage generation circuit according to the first embodiment depicted in FIG. 6, the reference voltage generation circuit depicted in FIG. 13 includes an NMOS transistor Q10, PMOS transistors Q11, Q12, Q13, PN diodes D1, D2, resistors R3, R4 and a differential amplifier A2. Further, in the reference voltage generation circuit depicted in FIG. 13, after a first forward direction voltage VBE1 is increased by (R1+ R2)/R2 times, a resistance ratio, by a differential amplifier A1 and the resistors R1, R2, the voltage V11 thus obtained is input to the negative electrode input of the differential amplifier A2 through the resistor R3.

On the other hand, in the reference voltage generation circuit depicted in FIG. 13, differently from FIG. 6, a second forward direction voltage VBE2 is decreased by R6/(R5+R6) times, a resistance ratio of the resistors R5, R6, through a differential amplifier A3, and the obtained voltage V13 is input to the positive electrode input of the differential amplifier A2, as a voltage V13 (={R6/(R5+R6)}VBE2).

In short, in the reference voltage generation circuit depicted in FIG. 13, the first forward direction voltage VBE1 is shifted to a higher voltage, and the second forward direction voltage VBE2 is shifted to a lower voltage, so that a characteristic having intersection at the temperature T1 is generated so as to allow the voltage V12-V11 at the resistor R3 to have a positive temperature characteristic, as depicted in FIGS. 7 (2), (3) and FIGS. 12 (2), (3). Other operating characteristics are identical to the characteristics of FIGS. 6 and 11.

Thus, the reference voltage Vref generated by the reference voltage generation circuit depicted in FIG. 13 is as follows.

$$Vref = \underbrace{\{R6/(R5+R6)\}*VBE2}_{\text{negative temperature characteristic}} + \underbrace{(R4/R3)*[\{R6/(R5+R6)\}*VBE2 - \{(R1+R2)/R2\}*VBE1]}_{\text{positive temperature characteristic}}$$

V12 = V13 (shift down VBE2)   V12 = V13 (shift down VBE2)   V11 (shift up VBE1)

As represented by the above expression, by the differential amplifier A3 which generates V13 having a negative temperature characteristic and V12-V11(VBE1) having a positive temperature characteristic, the reference voltage Vref is settable to have any one of a positive temperature characteristic, a negative temperature characteristic and no temperature characteristic, according to the resistance ratio R4/R3.

As having been described above, according to the reference voltage generation circuit of the present embodiment, it is possible to generate the reference voltage Vref having a fixed voltage at the prescribed temperature T1, and having a temperature characteristic of an arbitrary inclination from positive to negative, according to the resistance ratio R4/R3. Therefore, by providing a voltage regulator which generates internal power VDD based on the above reference voltage Vref, and further by providing an RC oscillation circuit, which is constituted by the inverters of odd-numbered stages, in which the above internal power VDD is used as a power supply, and an RC circuit, it is possible to set the temperature characteristic of an oscillation frequency to have an arbitrary positive or a negative inclination.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A reference voltage generation circuit comprising:
a first PN junction element having a first forward direction voltage;
a second PN junction element having a different current density from the first PN junction element and having a second forward direction voltage higher than the first forward direction voltage;
a first differential amplifier having a first input configured to be connected to an anode of the first PN junction element and a second input configured to be connected to a first connection node between a first resistor and a second resistor disposed in series between a first output of the first differential amplifier and a first potential, and configured to generate a first output voltage at the first output; and
a second differential amplifier having a first input configured to be connected to an anode of the second PN junction element and a second input configured to be connected to a second connection node between a fourth resistor and a third resistor disposed in series between a second output of the second differential amplifier and the first output of the first differential amplifier, and configured to generate a reference voltage at the second output,
wherein the first output voltage has a different temperature-dependent characteristic from the second forward direction voltage, the first and the second resistors have a resistance ratio so that the first output voltage is identical to the second forward direction voltage at a first temperature, that is within a room temperature range, and a resistance ratio between the third and the fourth resistors is variable, wherein, according to a variably adjusted resistance ratio between the third and the fourth resistors, an inclination of a temperature-dependent characteristic of the reference voltage is varied to be negative, zero and positive while the reference voltage at the first temperature is maintained to a constant voltage.

2. The reference voltage generation circuit according to claim 1,
wherein the fourth resistor includes a plurality of fourth resistance elements connected in series,
the second differential amplifier includes a differential amplifier circuit and a plurality of output transistors disposed in parallel and each having a gate to which an output of the differential amplifier is supplied,
the plurality of output transistors are connected to respective terminals of the plurality of fourth resistance elements,
the plurality of output transistors are selectively activated by an adjustment signal for the fourth resistor, and
the resistance value of the fourth resistor is variably adjusted by the adjustment signal.

3. The reference voltage generation circuit according to claim 1,
wherein the fourth resistor includes a plurality of fourth resistance elements connected in series, and
the reference voltage generation circuit includes a switch which variably switches the number of the plurality of fourth resistance elements according to an adjustment signal for the fourth resistor.

4. A reference voltage generation circuit comprising:
a first PN junction element having a first forward direction voltage;
a second PN junction element having a different current density from the first PN junction element and a second forward direction voltage higher than the first forward direction voltage;
a first differential amplifier having a first input configured to input the first forward direction voltage and a second input configured to input a first output of the first differential amplifier, and configured to generate the first forward direction voltage at the first output;
a third differential amplifier having a first input configured to input the second forward direction voltage and a second input configured to input a third output of the third differential amplifier, a fifth resistor and a sixth resistor being provided between the third output and a first potential, and a third output voltage being generated at a third connection node between the fifth and the sixth resistors; and
a second differential amplifier having a first input configured to input the third output voltage and a second input configured to input a second connection node between a fourth resistor and a third resistor, disposed in series between a second output of the second differential amplifier and the first output of the first differential amplifier, and configured to generate a reference voltage at the second output,
wherein the third output voltage has a different temperature-dependent characteristic from the first forward direction voltage, the fifth and the sixth resistors have a resistance ratio so that the third output voltage is identical to the first forward direction voltage at a first temperature, that is within a room temperature range, and a resistance ratio between the third and the fourth resistors is variable,
wherein, according to a variably adjusted resistance ratio between the third and the fourth resistors, an inclination of a temperature-dependent characteristic of the reference voltage is varied to be negative, zero and positive while the reference voltage at the first temperature is maintained to a constant voltage.

5. A reference voltage generation circuit comprising:
a first PN junction element having a first forward direction voltage;
a second PN junction element having a different current density from the first PN junction element and a second forward direction voltage higher than the first forward direction voltage;
a first differential amplifier having a first input configured to input the first forward direction voltage and a second input configured to input a first connection node between a first resistor and a second resistor, disposed in series between a first output of the first differential amplifier and a first potential, and configured to generate a first output voltage at the output thereof;
a third differential amplifier having a first input configured to input the second forward direction voltage and a second input configured to input a third output of the third differential amplifier, a fifth resistor and a sixth resistor being provided between the third output of the third differential amplifier and the first potential, and a third output voltage being generated at a third connection node between the fifth and the sixth resistors; and
a second differential amplifier having a first input configured to input the third output voltage and a second input configured to input a second connection node between a fourth resistor and a third resistor, disposed in series between a second output of the second differential amplifier and the output of the first differential amplifier, and configured to generate a reference voltage at the second output,
wherein the first output voltage has a different temperature-dependent characteristic from the third output voltage, the first and the second resistors have a first resistance ratio and the fifth and the sixth resistors have a second resistance ratio so that the first output voltage is identical to the third output voltage at a first temperature, that is within a room temperature range, and a resistance ratio between the third and the fourth resistors is variable,
wherein, according to a variably adjusted resistance ratio between the third and the fourth resistors, an inclination of a temperature-dependent characteristic of the reference voltage is varied to be negative, zero and positive while the reference voltage at the first temperature is maintained to a constant voltage.

6. An oscillation circuit comprising:
a reference voltage generation circuit having a first PN junction element having a first forward direction voltage; a second PN junction element having a different current density from the first PN junction element and having a second forward direction voltage higher than the first forward direction voltage; a first differential amplifier having a first input configured to be connected to an anode of the first PN junction element and a second input configured to be connected to a first connection node between a first resistor and a second resistor disposed in series between a first output of the first differential amplifier and a first potential, and configured to generate a first output voltage at the first output; and a second differential amplifier having a first input configured to be connected to an anode of the second PN junction element and a second input configured to be connected to a second connection node between a fourth resistor and a third resistor disposed in series between a second output of the second differential amplifier and the first output of the first differential amplifier, and configured to generate a reference voltage at the second output, wherein the first output voltage has a different temperature-dependent characteristic from the second forward direction voltage, the first and the second resistors have a resistance ratio so that the first output voltage is identical to the second forward direction voltage at a first temperature, that is within a room temperature range, and a resistance ratio between the third and the fourth resistors is variable, wherein, according to a variably adjusted resistance ratio between the third and the fourth resistors, an inclination of a temperature-dependent characteristic of the reference voltage is varied to negative, zero and positive while the reference voltage at the first temperature is maintained to a constant voltage;

a power generation unit to which a first power voltage is supplied and which generates a second power voltage based on the reference voltage; and an oscillator including a plurality of inverters which are connected in a ring shape and to which the second power voltage is supplied.

7. The oscillation circuit according to claim 6, further comprising:

a seventh resistor and a capacitor at either one of output nodes of the inverters, wherein, according to an oscillator adjustment signal, one or both of a resistance value of the seventh resistor and a capacitance value of the capacitor are configured to be adjustable.

8. An oscillation frequency calibration method for an oscillation circuit which includes:

a reference voltage generation circuit having a first PN junction element having a first forward direction voltage; a second PN junction element having a different current density from the first PN junction element and having a second forward direction voltage higher than the first forward direction voltage; a first differential amplifier having a first input configured to be connected to an anode of the first PN junction element and a second input configured to be connected to a first connection node between a first resistor and a second resistor disposed in series between a first output of the first differential amplifier and a first potential, and configured to generate a first output voltage at the first output; and a second differential amplifier having a first input configured to be connected to an anode of the second PN junction element and a second input configured to be connected to a second connection node between a fourth resistor and a third resistor disposed in series between a second output of the second differential amplifier and the first output of the first differential amplifier, and configured to generate a reference voltage at the second output, wherein a resistance ratio between the third and the fourth resistors is variable, the first output voltage has a different temperature-dependent characteristic from the second forward direction voltage, and the first and the second resistors have a resistance ratio so that the first output voltage is identical to the second forward direction voltage at a first temperature, that is within a room temperature range, a power generation unit to which a first power voltage is supplied and which generates a second power voltage based on the reference voltage;

an oscillator including a plurality of inverters which are connected in a ring shape and to which the second power voltage is supplied; and a seventh resistor and a capacitor at either one of output nodes of the inverters, wherein one or both of a resistance value of the seventh resistor and a capacitance value of the capacitor are configured to be adjustable according to an adjustment signal of the oscillator, the oscillation frequency calibration method comprising:

setting an adjustment signal for the oscillator so that the oscillation frequency becomes a first desired frequency at the first temperature; and setting an adjustment signal for a resistance ratio between the third and the fourth resistors so that the oscillation frequency becomes a second desired frequency at a second temperature different from the first temperature while the first desired frequency being set at the first temperature is maintained, so as to set a temperature-dependent characteristic of the oscillation frequency to be any one of negative, zero and positive.

9. The oscillation frequency calibration method according to claim 8, wherein, according to a variably adjusted resistance ratio between the third and the fourth resistors, an inclination of a temperature-dependent characteristic of the reference voltage is varied to be negative, zero and positive while the reference voltage at the first temperature is maintained to a constant voltage.

10. An oscillation circuit comprising:

a reference voltage generation circuit having a first PN junction element having a first forward direction voltage; a second PN junction element having a different current density from the first PN junction element and a second forward direction voltage higher than the first forward direction voltage; a first differential amplifier having a first input configured to input the first forward direction voltage and a second input configured to input a first output of the first differential amplifier, and configured to generate the first forward direction voltage at the first output; a third differential amplifier having a first input configured to input the second forward direction voltage and a second input configured to input a third output of the third differential amplifier, a fifth resistor and a sixth resistor being provided between the third output and a first potential, and a third output voltage being generated at a third connection node between the fifth resistor and the sixth resistor; and a second differential amplifier having a first input configured to input the third output voltage and a second input configured to input a second connection node between a fourth resistor and a third resistor, disposed in series between a second output of the second differential amplifier and the first output of the first differential amplifier, and configured to generate a reference voltage at the second output, wherein the third output voltage has a different temperature-dependent characteristic from the first forward direction voltage, the fifth and the sixth resistors have a resistance ratio so that the third output voltage is identical to the first forward direction voltage at a first temperature, that is within a room temperature range, and a resistance ratio between the third and the fourth resistors is variable, wherein, according to a variably adjusted resistance ratio between the third and the fourth resistors, an inclination of a temperature-dependent characteristic of the reference voltage is varied to be negative, zero and positive while the reference voltage at the first temperature is maintained to a constant voltage;
a power generation unit to which a first power voltage is supplied and which generates a second power voltage based on the reference voltage; and
an oscillator including a plurality of inverters which are connected in a ring shape and to which the second power voltage is supplied.

11. An oscillation frequency calibration method for an oscillation circuit which includes:
a reference voltage generation circuit having a first PN junction element having a first forward direction voltage; a second PN junction element having a different current density from the first PN junction element and a second forward direction voltage higher than the first forward direction voltage; a first differential amplifier having a first input configured to input the first forward direction voltage and a second input configured to input a first output of the first differential amplifier, and configured to generate the first forward direction voltage at the first output; a third differential amplifier having a first input configured to input the second forward direction voltage and a second input configured to input a third output of the third differential amplifier, a fifth resistor and a sixth resistor being provided between the third output and a first potential, and a third output voltage being generated at a third connection node between the fifth and the sixth resistors; and a second differential amplifier having a first input configured to input the third output voltage and a second input configured to input a second connection node between a fourth resistor and a third resistor, disposed in series between a second output of the second differential amplifier and the first output of the first differential amplifier, and configured to generate a reference voltage at the second output, wherein the third output voltage has a different temperature-dependent characteristic from the first forward direction voltage, the fifth and the sixth resistors have a resistance ratio so that the third output voltage is identical to the first forward direction voltage at a first temperature, that is within a room temperature range, and a resistance ratio between the third and the fourth resistors is variable;
a power generation unit to which a first power voltage is supplied and which generates a second power voltage based on the reference voltage;
an oscillator including a plurality of inverters which are connected in a ring shape and to which the second power voltage is supplied; and
a seventh resistor and a capacitor at either one of output nodes of the inverters,
wherein one or both of a resistance value of the seventh resistor and a capacitance value of the capacitor are configured to be adjustable according to an adjustment signal of the oscillator,
the oscillation frequency calibration method comprising:
setting an adjustment signal for the oscillator so that the oscillation frequency becomes a first desired frequency at the first temperature; and
setting an adjustment signal for a resistance ratio between the third and the fourth resistors so that the oscillation frequency becomes a second desired frequency at a second temperature different from the first temperature while the first desired frequency being set at the first temperature is maintained, so as to set a temperature-dependent characteristic of the oscillation frequency to be any one of negative, zero and positive.

12. The oscillation frequency calibration method according to claim 11,
wherein, according to a variably adjusted resistance ratio between the third and the fourth resistors, an inclination of a temperature-dependent characteristic of the reference voltage is varied to be negative, zero and positive while the reference voltage at the first temperature is maintained to a constant voltage.

13. An oscillation circuit comprising:
a reference voltage generation circuit having a first PN junction element having a first forward direction voltage; a second PN junction element having a different current density from the first PN junction element and a second forward direction voltage higher than the first forward direction voltage; a first differential amplifier having a first input configured to input the first forward direction voltage and a second input configured to input a first connection node between a first resistor and a second resistor, disposed in series between a first output of the first differential amplifier and a first potential, and configured to generate a first output voltage at the output thereof; a third differential amplifier having a first input configured to input the second forward direction voltage and a second input configured to input a third output of the third differential amplifier, a fifth resistor and a sixth resistor being provided between the third output of the third differential amplifier and the first potential, and a third output voltage being generated at a third connection node between the fifth and the sixth resistors; and a second differential amplifier having a first input configured to input the third output voltage and a second input configured to input a second connection node between a fourth resistor and a third resistor, disposed in series between a second output of the second differential amplifier and the output of the first differential amplifier, and configured to generate a reference voltage at the second output, wherein the first output voltage has a different temperature-dependent characteristic from the third output voltage, the first and the second resistors have a first resistance ratio and the fifth and the sixth resistors have a second resistance ratio so that the first output voltage is identical to the third output voltage at a first temperature, that is within a room temperature range, and a resistance ratio between the third and the fourth resistors is variable, wherein, according to a variably adjusted resistance ratio between the third and the fourth resistors, an inclination of a temperature-dependent characteristic of the reference voltage is varied to be negative, zero and positive while the reference voltage at the first temperature is maintained to a constant voltage;
a power generation unit to which a first power voltage is supplied and which generates a second power voltage based on the reference voltage; and
an oscillator including a plurality of inverters which are connected in a ring shape and to which the second power voltage is supplied.

14. An oscillation frequency calibration method for an oscillation circuit which includes:
a reference voltage generation circuit having a first PN junction element having a first forward direction voltage; a second PN junction element having a different current density from the first PN junction element and a second forward direction voltage higher than the first forward direction voltage; a first differential amplifier having a first input configured to input the first forward direction voltage and a second input configured to input a first connection node between a first resistor and a second resistor, disposed in series between a first output of the first differential amplifier and a first potential, and configured to generate a first output voltage at the output thereof; a third differential amplifier having a first input configured to input the second forward direction voltage and a second input configured to input a third output of the third differential amplifier, a fifth resistor and a sixth resistor being provided between the third output of the third differential amplifier and the first potential, and a third output voltage being generated at a third connection node between the fifth and the sixth resistors; and a second differential amplifier having a first input configured to input the third output voltage and a second input configured to input a second connection node between a fourth resistor and a third resistor, disposed in series between a second output of the second differential amplifier and the output of the first differential amplifier, and configured to generate a reference voltage at the second output, wherein the first output voltage has a different temperature-dependent characteristic from the third output voltage, the first and the second resistors have a first resistance ratio and the fifth and the sixth resistors have a second resistance ratio so that the first output voltage is identical to the third output voltage at a first temperature, that is within a room temperature range, and a resistance ratio between the third and the fourth resistors is variable;

a power generation unit to which a first power voltage is supplied and which generates a second power voltage based on the reference voltage;

an oscillator including a plurality of inverters which are connected in a ring shape and to which the second power voltage is supplied; and a seventh resistor and a capacitor at either one of output nodes of the inverters, wherein one or both of a resistance value of the seventh resistor and a capacitance value of the capacitor are configured to be adjustable according to an adjustment signal of the oscillator, the oscillation frequency calibration method comprising:

setting an adjustment signal for the oscillator so that the oscillation frequency becomes a first desired frequency at the first temperature; and setting an adjustment signal for a resistance ratio between the third and the fourth resistors so that the oscillation frequency becomes a second desired frequency at a second temperature different from the first temperature while the first desired frequency being set at the first temperature is maintained, so as to set a temperature-dependent characteristic of the oscillation frequency to be any one of negative, zero and positive.

15. The oscillation frequency calibration method according to claim 14, wherein, according to a variably adjusted resistance ratio between the third and the fourth resistors, an inclination of a temperature-dependent characteristic of the reference voltage is varied to be negative, zero and positive while the reference voltage at the first temperature is maintained to a constant voltage.

\* \* \* \* \*